United States Patent [19]
Schöberl

[11] 3,891,858
[45] June 24, 1975

[54] OPTICAL-ELECTRONIC SEMICONDUCTOR COUPLING ELEMENT

[75] Inventor: Werner Schöberl, Heilbronn, Germany

[73] Assignee: Licentia Patent-Verwaltungs-GmbH, Frankfurt am Main, Germany

[22] Filed: Nov. 1, 1973

[21] Appl. No.: 411,732

[30] Foreign Application Priority Data

Nov. 2, 1972 Germany ............ 2253699

[52] U.S. Cl. ............ 250/551; 250/239
[51] Int. Cl. ............ G02f 1/28
[58] Field of Search ....... 250/551, 552, 213 A, 239; 313/108 D; 317/235 N

[56] References Cited

UNITED STATES PATENTS

| | | | |
|---|---|---|---|
| 3,143,655 | 8/1964 | Strandberg | 250/551 |
| 3,153,149 | 10/1964 | Finigian | 250/551 |
| 3,413,480 | 11/1968 | Biard | 250/551 |
| 3,443,140 | 5/1969 | Ing | 313/108 D |
| 3,562,527 | 2/1971 | Chaimowicz | 250/551 |
| 3,660,669 | 5/1972 | Grenon | 250/239 |

OTHER PUBLICATIONS

"Solid State Optoelectronics Short Form Catalog," of Monsanto Commercial Products, Co., Pages 5, 7–9, Mar. 15, 1974.

*Primary Examiner*—James W. Lawrence
*Assistant Examiner*—D. C. Nelms
*Attorney, Agent, or Firm*—Spencer & Kaye

[57] ABSTRACT

An optical-electronic semiconductor coupling element comprises two semiconductor components, one emitting light and one being sensitive thereto, each component being placed in a separate housing means having lens shaped light inlet or outlet portions, the two housing means being joined together by an outer housing means so that the lens shaped portions lie directly opposite each other.

7 Claims, 5 Drawing Figures

OPTICAL-ELECTRONIC SEMICONDUCTOR COUPLING ELEMENT

BACKGROUND OF THE INVENTION

The invention relates to an optical-electronic semiconductor component, comprising a semiconductor component emitting a light and a light-sensitive semmiconductor component.

Hitherto an optical-electronic coupling element has been known, in which a light-sensitive semiconductor body and a light-emitting semiconductor body are incorporated in a common housing. The two non-encapsulated semiconductor bodies are then embedded in insulation material, common to both semiconductor bodies, which material is permeable to light. This insulation material is, for example, a light-conducting lacquer. In the case of a large coupling coefficient the spacing between the light emitter and the light receiver must be small. Therefore in the case of the known arrangements only small voltage insulation is achieved.

SUMMARY OF THE INVENTION

It is an object of the invention to provide a coupling element in which the coupling coefficient is larger and at the same time a greater voltage insulation is achieved.

According to a first aspect of the invention, there is provided an optical-electronic semiconductor coupling element, comprising a semiconductor component emitting a light and a light sensitive semiconductor component, characterised in that each of the two components is incorporated in a separate light-permeable housing, each housing being constructed in a lens shaped manner at the part provided for the light input or the light output, in that at least the two lens shaped parts are so incorporated in an outer housing that these two lens shaped parts lie directly opposite each other and in that this outer housing is embedded in a plastic mass.

According to a second aspect of the invention, there is provided an optical electronic semiconductor coupling element comprising a light emitting semiconductor component, first housing means for said light emitting semiconductor component defining a lens shaped portion for light output from said light emitting semiconductor component, a light sensitive semiconductor component, a second housing means for said light sensitive semiconductor component defining a lens shaped portion for light input to said light sensitive semiconductor component and an outer housing means for joining together said first and second housing with the said lens shaped parts of said first and second housing means lying directly opposite each other.

BRIEF DESCRIPTION OF THE DRAWINGS

The invention will now be described in greater detail by way of example with reference to the drawings, in which.

DESCRIPTION OF THE PREFERRED EMBODIMENT

Figure 1:
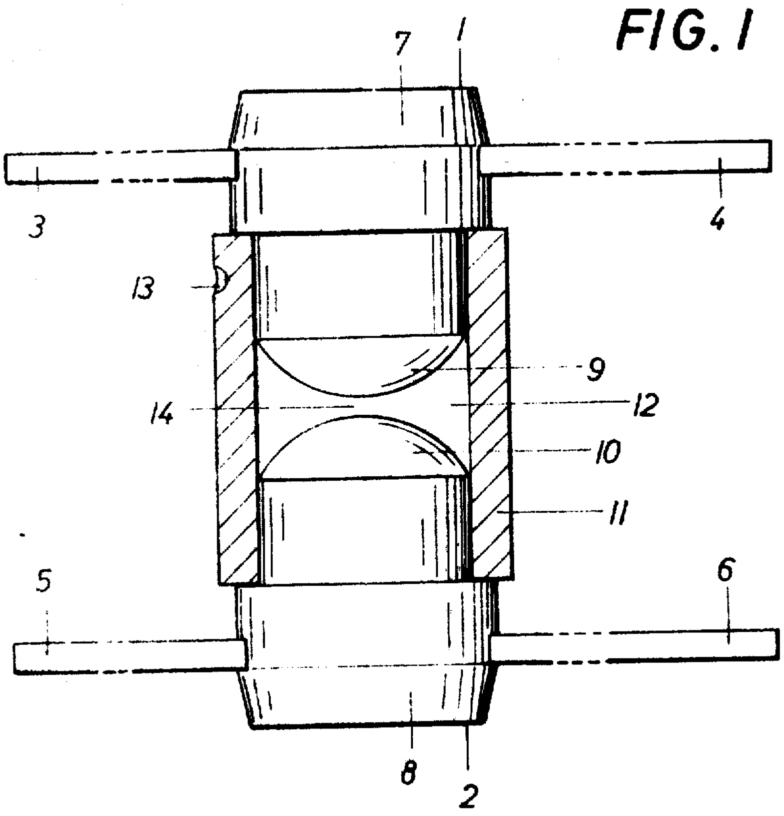
FIG. 1 is a view partly in section of the main parts of one form of coupling element in accordance with the invention.

Basically, in a coupling element of the type described at the outset, in accordance with the invention, each of the two components is incorporated in a separate light-permeable housing, each housing being constructed in a lens-shaped manner at the part provided for the light input or light output, in that, at least the two lens-shaped parts are so incorporated in an outer housing that the two lens-shaped parts lie directly opposite each other and in that this outer housing is embedded in a plastic mass.

The separate housings of the two components may have the form of a lens of transparent plastic at the front surface provided for the light output or light input. The air gap between the front face of the two separate housings is, in a preferred form of embodiment, approximately 0.1 mm. The coupling coefficient has the value of approximately 0.5 to 1, whereas voltage insulation from 8 to 10 kV is achieved.

The accommodation body is preferably constructed in a cylinder shaped manner and provided with a through bore.

The optical-electronic coupling element is preferably produced by incorporating the separately encapsulated components in the accommodation body with their lens-shaped constructed front faces inserted into the outside openings opposite each other. Thereafter the connection lines projecting out of the separate housings are connected to connection strips, which project from the edge of a frame-shaped contacting strip into the interior of the frame.

The separate housing, the accommodation body and the ends of the connection strips connected to the connection line are then embedded in a plastic mass. Finally the connection strips are separated from the frame-shaped contacting strips and are further used as connection lines for the entire arrangement.

In the case of another preferred form of embodiment the semiconductor body is already connected to the connection strips, which later also form the feed lines to the entire arrangement. For this purpose the semiconductor body of an individual component is secured on a metal carrier body. The electrodes of the semiconductor body are connected to metal connection strips. Connection strips and carrier bodies are preferably part of a coherent contacting strip, which is later divided into connection strips insulated from each other by separating parts lying between the connection strips. The carrier body and the connection strips are so embedded in the light-permeable plastic that a baseplate results, in the central part of which a lens-formed housing part results, which encloses the semiconductor component. The lens-shaped part is surrounded by an outer housing part arranged on the baseplate, constructed in a frame-shaped manner and having a stepped edge level. The other semiconductor component is incorporated in a similar housing. The two housings thus have edge structures which fit each other so that, when putting the two housings together, the two lens-shaped parts are opposite each other on all sides and are enclosed in a joint-tight manner by parts of the outer housing. Both housing parts are then embedded again in a plastic mass.

Referring now to the drawings, FIG. 1 shows two separate housings 1 and 2. The housing 1 comprises, for example, the emitter and thus contains the semiconductor component emitting the light. In this case it is a question of, for example, an infra-red luminescence diode. Then the light-sensitive component, preferably a photo transistor, is accommodated in the housing 2. Feedlines 3 and 4 lead into the housing interior of the luminescence diode, whereas the photo element is connected to the feedlines 5 and 6. The housing bases 7 and 8 provided with the feedlines comprise transparent plastic, which are connected to a lens shaped part 9 or 10. The lens shaped parts of the two housings are inserted into a tubular receiving body 11 from the opposite ends of the bore 12. In this case the housing bases 7 and 8 serve as a stop spacing the parts 9 and 10 placed on them. The body 11 comprises, preferably, a plastic cylinder, which is provided with a bore 12 extending throughout the length of the cylinder. A notch 13 on the outer side of the cylinder serves as an orientation mark. After the incorporation of the two housings in the body 11 there remains between the lens-shaped front faces of the individual housings preferably a small airgap 14, which is, e.g., 0.1 mm, in order to obtain an optimal coupling coefficient. The high voltage insulation results from the large spacing and thus the large outer creepage path between the electrodes and the semiconductor components.

Figure 2:
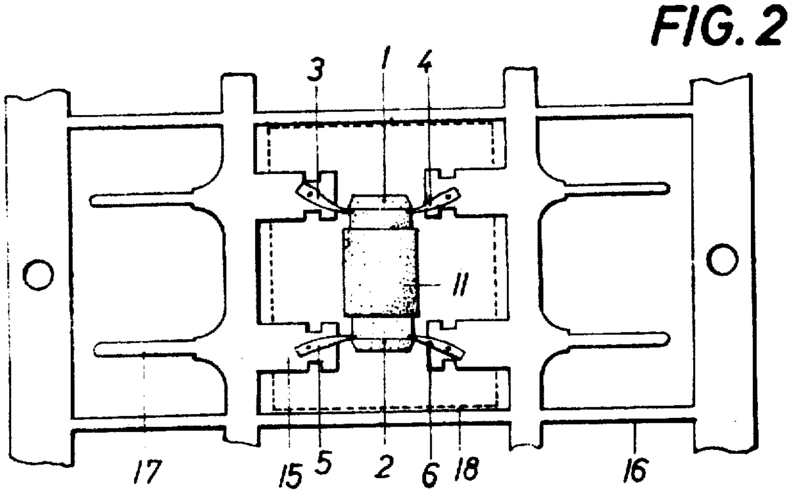
FIG. 2 is a view showing the attachment of the coupling element parts of FIG. 1 into a contacting strip.
Figure 3:
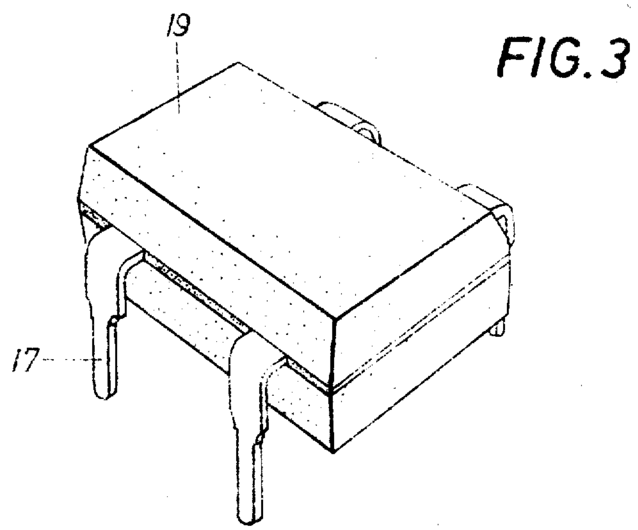
FIG. 3 is a perspective view of a finished coupling element.

FIG. 2 shows how the feedlines 3, 4, 5 and 6 of the entire arrangement are brought into connection with connection strips 15. These connection strips are a part of a frame-shaped contacting strip 16, in which the said connection strip 15 projects into the frame interior. In an extension of the connection strips, feedlines 17, which later form the feedlines of the entire arrangement, lead outwardly from the frame. The feedlines 3 to 6 of the two individual housings are now bent up and secured to one connection strip 15 each. This can be effected for example by spot welding. After this the individual housings, the connection strips and the tubular body are embedded in a plastic mass whose outline is shown, for example, by the broken line 18. After that the parts of the metal frame-shaped contacting strips located between the connection strips are removed so that there is formed a housing having feedlines 17 which are insulated from each other. Such a housing is shown in FIG. 3. The incorporation of separately encapsulated individual components into an entire housing has proved to be very advantageous in the case of the optical-electronic coupling element described, since, now, extremely high voltage insulation can be achieved at very high coupling coefficients. The insulating materials and plastic materials available commercially are used for casting the individual housings.

Figure 4:
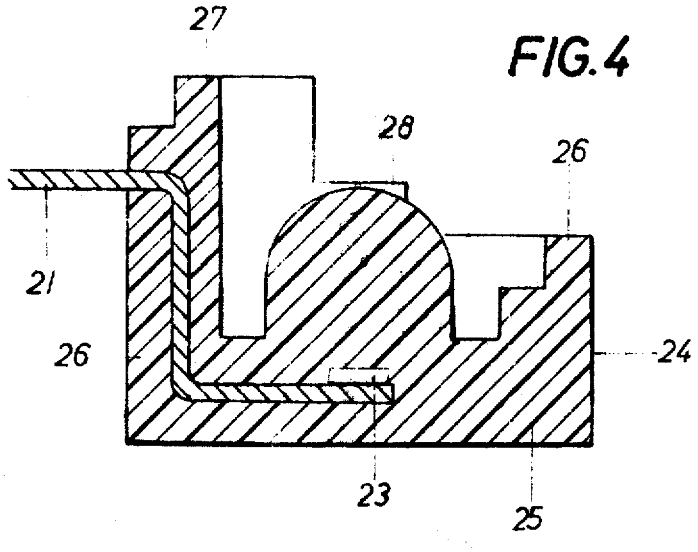
FIG. 4 is a sectional view of a modified housing part for one of the semiconductor components of a coupling element.
Figure 5:
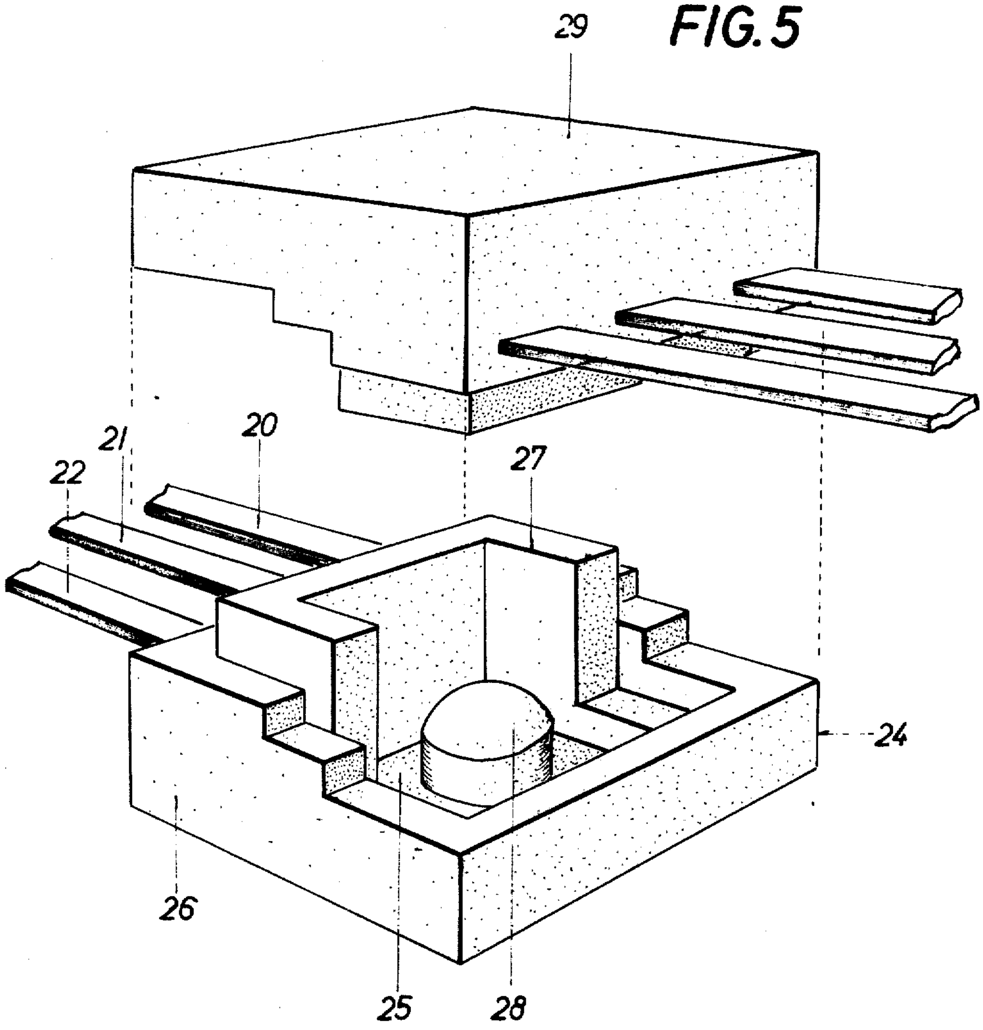
FIG. 5 is a perspective, partly exploded view of the complete housing of which part is shown in FIG. 4.

FIG. 4 shows in section and FIG. 5 in perspective view, a modified housing for a semiconductor component. It comprises three connection lines 20, 21 and 22, which originally were part of a coherent contacting strip. The connection strips are bent up double in accordance with FIG. 4. The center connection strip carries the semiconductor body 23. The semiconductor body and the connection strips are then embedded in a housing 24 of light-permeable plastic, which comprises a baseplate 25 and a frame-shaped part 26 with a stepped edge level. Since a further housing should be set onto this housing, the frame-shaped part is, in order to avoid any displacements of the housing parts with respect to each other, made at least partially with the double wall, wherein the height of one part 27 differs with respect to the other parts 26.

In accordance with FIG. 5 the inner wall 27 comprises half the frame-shaped housing cross section and is higher than the outer wall 26. The lens-shaped housing part 28, which encloses the semiconductor body, projects upwardly in the central part of the baseplate. The connection electrodes of the semiconductor body 23 are connected in an electrically conductive manner to the strips 20 and 22 by means of thin feedline wires. These connections are also embedded in the plastics. In accordance with FIG. 5, now, a mating counterpiece 29 of like type which likewise contains a semiconductor component, is set onto the above described housing 24 in an inverted manner so that a plastic housing which is closed on all sides results, and which contains the light emitter and the light receiver lying directly opposite each other. The entire arrangement of the housings 24 and 29 are then further preferably embedded in a plastic mass, which connects the housings together permanently and in an air impermeable manner.

While the exemplary embodiment shown in FIGS. 4 and 5 has a rectangular shaped cross section, housings with circular ring-shaped cross section can be used, wherein, again, preferably a stepped housing edge is used, which facilitates an easy joining together of the parts. Any lateral displacement of the housing parts with respect to each other is prevented, in principle, by the partial double wall. The lens-shaped housing parts are thus automatically lined up with respect to each other when the housings are assembled.

It will be understood that the above description of the present invention is susceptible to various modifications, changes and adaptations.

What is claimed is:

1. An optical-electronic semiconductor coupling element, comprising:

a. a light-emitting semiconductor component;

b. a light-sensitive semiconductor component;

c. first light-permeable housing means, made of plastic, within which said light-emitting component is embedded, said first housing means having a lens-shaped part through which light emittered by said light-emitting component may exit;

d. second light-permeable housing means, made of plastic, within which said light-sensitive component is embedded, said second housing means having a lens-shaped part through which light that is to impinge on said light-sensitive component may enter; and e. third, outer housing means, made of plastic, surrounding at least part of said first and second housing means, said third housing means comprising a tubular body and said first and second housing means being arranged at opposite ends of said tubular body, respectively, the lens-shaped parts of said first and second housing means being generally in the center of said tubular body and being positioned with their respective lens-shaped parts directed toward each other, said lens-shaped parts having front faces which form between themselves a gap of approximately 0.1 mm.

2. An element as defined in claim 1, wherein said tubular body is cylindrical.

3. An element as defined in claim 1, wherein said outer housing means comprises two parts, one of which is integral with said first housing means and the other of which is integral with said second housing means.

4. An optical-electronic semiconductor coupling element, comprising:

a. a light-emitting semiconductor component;
b. a light-sensitive semiconductor component;
c. first light-permeable housing means, made of plastic, within which said light-emitting component is embedded, said first housing means having a lens-shaped part through which light emitted by said light-emitting component may exit;
d. second light-permeable housing means, made of plastic, within which said light-sensitive component is embedded, said second housing means having a lens-shaped part through which light that is to impinge on said light-sensitive component may enter; and
e. third, outer housing means, made of plastic, surrounding at least part of said first and second housing means, said outer housing means comprising two parts, one of which is integral with said first housing means and the other of which is integral with said second housing means, each outer housing part having a stepped wall, one part of said wall extending peripherally throughout the circumference of the associated lens-shaped housing part and another part of said wall extending peripherally throughout half of such circumference, the two outer housing parts being complementarily configured such that when said first and second housing means, and the associated outer housing parts, are assembled, the four wall parts of the two outer housing parts together completely surround the lens-shaped parts of both said first and second housing means.

5. An element as defined in claim 4, wherein the stepped wall has a double-wall configuration.

6. An optical-electronic semiconductor coupling element, comprising:

a. a light-emitting semiconductor component;
b. a light-sensitive semiconductor component;
c. first light-permeable housing means, made of plastic, within which said light-emitting component is embedded, said first housing means having a lens-shaped part through which light emitted by said light-emitting component may exit;
d. second light-permeable housing means, made of plastic, within which said light-sensitive component is embedded, said second housing means having a lens-shaped part through which light that is to impinge on said light-sensitive component may enter; and
e. third, outer housing means, made of plastic, surrounding at least part of said first and second housing means, said outer housing means comprising two parts, one of which is integral with said first housing means and the other of which is integral with said second housing means;
f. said semiconductor components being secured to respective metal carrier bodies and electrodes of each semiconductor component being connected to respective metal connection strips, said carrier bodies and said connection strips being so embedded in each respective housing means that in each there is formed a base plate which is surrounded by an outer housing part which is frame-shaped and has a stepped edge level with said lens-shaped housing part enclosing the semiconductor component and arranged in the central part of said base plate, said first and second housing means, and the associated outer housing parts, having a like construction so that, on putting said two housing means together, said two lens-shaped parts are enclosed lying opposite each other on all sides and joint-tight by part of the outer housing.

7. An element as defined in claim 6, further comprising a mass made of plastic within which all of said housing means are embedded.

* * * * *